United States Patent [19]
Ito et al.

[11] Patent Number: 5,847,466
[45] Date of Patent: Dec. 8, 1998

[54] SEMICONDUCTOR DEVICE AND MANUFACTURING METHOD FOR THE SAME

[75] Inventors: Kazunori Ito; Mitsugu Irinoda, both of Kakogawa; Kaichi Ueno, Sanda; Mamoru Ishida; Takahiko Kuroda, both of Kobe, all of Japan

[73] Assignee: Ricoh Company, Ltd., Tokyo, Japan

[21] Appl. No.: 759,441

[22] Filed: Dec. 5, 1996

[30]     Foreign Application Priority Data

Dec. 7, 1995  [JP]  Japan ................................. 7-318923
Apr. 26, 1996 [JP]  Japan ................................. 8-106560

[51] Int. Cl.$^6$ ......................... H01L 23/48; H01L 23/52; H01L 29/40
[52] U.S. Cl. ......................... 257/775; 257/750; 257/758; 257/774; 257/763
[58] Field of Search ..................... 257/775, 750, 257/758, 770, 764, 763, 752, 781, 774, 784

[56]           References Cited

U.S. PATENT DOCUMENTS 4,944,836  7/1990  Beyer et al. ........................... 156/645
5,149,674  9/1992  Freeman, Jr. et al. .................. 257/758
5,331,204  7/1994  Kuroda et al. .......................... 257/758
5,404,046  4/1995  Matsumoto et al. ..................... 257/750

*Primary Examiner*—Mahshid D. Saadat
*Assistant Examiner*—Jhihan B. Clark
*Attorney, Agent, or Firm*—Cooper & Dunham, LLP

[57]           ABSTRACT

A semiconductor device having a multilayer interconnection structure, includes a substrate having a metal interconnect layer provided thereon and N number (N being an integer of 2 or greater) of layers of insulating film formed one on top of another on the substrate. Each layer of insulating film has a metal interconnect layer including at least one bonding pad section provided thereon. At least one via hole filled with an electrically conductive material is provided in each of the layers for interconnecting metal interconnect layers. At least one bonding pad connecting hole filled with an electrically conductive material is provided in each of the layers for interconnecting bonding pad sections. The at least one bonding pad connecting hole is no more than twice as large in diameter as a smallest via hole.

24 Claims, 8 Drawing Sheets

SEMICONDUCTOR DEVICE AND MANUFACTURING METHOD FOR THE SAME

BACKGROUND OF THE INVENTION

1. Field of the Invention

The present invention relates to a semiconductor device having a multilayer interconnection structure and more particularly to a multilayer semiconductor device having a flattened inter-layer insulating film and a manufacturing method for the same.

2. Description of the Related Art

With the increasing trend toward higher performance and higher integration of large-scale integrated (LSI) circuits, the interconnecting pitch of circuit components is becoming smaller and the number of interconnecting layers in multilayer design is increasing. The increase in the number of interconnecting layers leads to uneven surfaces on the inter-layer insulating films.

When performing a lithography process for patterning on the insulating films and when dealing with such an extremely small interconnecting pitch, a high numerical aperture (NA) stepper value must be used. However, a high NA stepper value has a shallow focal depth and therefore requires that the substrate or layers have a high degree of flatness when producing a pattern thereon.

The multilayer design of interconnecting layers inevitably causes uneven surfaces on the inter-layer insulating films.

For example, as shown in FIG. 15, a first interconnecting layer 2 of metal is formed on substrate 1 which may have circuit components such as transistors, for example, (not shown) formed thereon. An interlayer insulating film 3 is formed thereon. Insulating film 3 is then patterned and etched to form a via hole 7a which is then filled with a conductive material. A second interconnecting layer 4 is then formed on insulating film 3 above via hole 7a. A second interlayer insulating film 5 is then formed on film 3. Insulating film 5 is then patterned and etched to form a via hole 7b which is also filled with a conductive material. However, as shown, as these multiple layers are stacked upon each other, when a third interconnecting layer 20 (20a and 20b) is formed on insulating film 5, a height difference (a) between portions 20a and 20b of the third interconnecting layer becomes great.

When operating at high NA stepper values necessary for lithographically patterning interconnecting layer 6 at small interconnecting pitch values, the focal depth is insufficient to operate under such great height variations between portions 20a and 20b. Accordingly, various methods have been used to attempt to flatten each layer. For example, a chemical mechanical polishing (CMP) technique is used to achieve flattening of the surfaces of each insulating film layer.

However, when forming via holes by etching on a substrate of a multilayer interconnection structure, especially of three layers or more, in which each layer has been flattened by CMP or a similar process, a problem is presented when the semiconductor includes a bonding pad or the like having a relatively large opening.

FIG. 13 and FIG. 14 show a conventional multilayer interconnecting structure. A first interconnecting layer 2 is formed by etching on a silicon substrate 1 on which transistors, etc. (not shown) have been formed. An interlayer insulating film 3 of BPSG or the like is formed to cover the first interconnecting layer 2. Flattening of film 3 is then performed by CMP or a similar process. A via hole (connecting hole) 7a is then formed by via hole etching. In addition, at the same time, a larger bonding pad hole 7c is also formed. Via hole 7a is typically the smallest size diameter hole and is used for electrically interconnecting sections of a circuit block or to electrically interconnect circuit blocks provided on different layers of an LSI chip. Bonding pad hole 7c is a large hole for exposing bonding pad 6a. The bonding pads are used to hold the multiple layers firmly together and are also used to electrically connect wires to the LSI chip. Accordingly, bonding pad hole 7c is required to be a relatively large hole when compared to via hole 7a. A second interconnecting layer 4 is then formed on the inter-layer insulating film 3 and a second inter-layer insulating film 5 is formed to cover the second interconnecting layer 4. Flattening of film 5 is then performed by CMP or a similar process.

A via hole 7b and a bonding pad hole 7d are formed in inter-layer insulating film 5 by via hole etching. Accordingly, as shown, the interconnecting section of a semiconductor device includes a wide interconnecting pattern bonding pad section 6 consisting of bonding pad interconnection layers 6a and 6b. Such bonding pads are usually provided for each interconnecting layer and, as noted above, provide a mechanism for securely holding each layer together with its adjacent layer and for providing a pad on the uppermost layer to which a wire can be electrically connected to provide an electrical connection to the various layers. However, as shown, these bonding pads require relatively large openings to be formed in the insulating films 3 and 5.

More specifically, when forming the via hole 7a, as shown in FIG. 14, the bonding pad interconnecting pattern section hole 7c is also formed by making an opening which is much larger than the other via holes 7a. When implementing multilayer interconnecting without flattening each inter-layer insulating film a problem is not presented. However, if each inter-layer insulating film is flattened, then forming the second via hole 7b and bonding hole 7d does present a problem.

For example, during the process of filling via hole 7a and bonding hole 7c, an electrically conductive material such as tungsten is deposited in the holes to a level above the height of the holes. The conductive material is then etched back to be flush with the top of the holes. However, due to the large size of hole 7c relative to hole 7a, the conductive material in hole 7c is etched away, typically leaving virtually no conductive material in hole 7c. Therefore, after second interconnecting layer 4 is formed and second insulating film 5 is deposited, a film thickness "a" of the inter-layer insulating film 5 which covers the second interconnecting layer 4 above a standard via hole 7a is substantially less than a film thickness "b" of the inter-layer insulating film 5 on the bonding pad interconnecting section above pattern section 6b. Such difference in depths causes a problem during etching for forming second via hole 7b and bonding pad hole 7d. That is, since the standard via hole 7b is shallower than the bonding pad hole 7d, deeper etching is required for hole 7d which inevitably causes considerable over-etching of via hole 7b. Such excessive over-etching widens via hole 7b posing problems of restricted design freedom as well as various other problems.

SUMMARY OF THE INVENTION

The present invention has been made in view of the problems described above and it is an object of the present invention to solve the problems caused by over-etching which occurs during via hole etching when forming a multilayer interconnection section of a semiconductor device which has been subjected to a flattening process.

The bonding pad interconnecting pattern section is a portion of a semiconductor chip which is bonded with an electrical wire and which secures the multiple layers together. Therefore, if its surface is uneven, then low bonding strength results. Hence, it is a second object of the present invention to maintain the flatness of the surface of the bonding pad interconnecting pattern section.

Further, it is another object of the present invention to increase the degree of design freedom by increasing the number of interconnecting layers which can be connected to the bonding pad interconnecting pattern section.

It is still another object of the present invention to provide a via hole pattern which employs a CMP process which permits easier inspection following via hole etching.

According to an aspect of the present invention, a semiconductor device having a multilayer interconnection structure comprises a substrate having a metal interconnect layer provided thereon and N number (N being an integer of 2 or greater) of layers of insulating film formed one on top of another on the substrate. Each layer of insulating film has a metal interconnect layer including at least one bonding pad section provided thereon. At least one via hole filled with an electrically conductive material is provided in each of the layers for interconnecting metal interconnect layers and at least one bonding pad connecting hole filled with an electrically conductive material provided in each of the layers for interconnecting bonding pad sections. The at least one bonding pad connecting hole is no more than twice as large in diameter as a smallest via hole.

According to another aspect, a semiconductor device having a multilayer interconnection structure, comprises a substrate having a metal interconnect layer provided thereon, N number (N being an integer of 2 or greater) of layers of insulating film formed one on top of another on the substrate. Each layer of insulating film has a metal interconnect layer provided thereo. Only the metal interconnect layer provided on the top layer of insulating film includes at least one bonding pad section electrically connected to one or more of the metal interconnect layers.

According to another aspect of the invention, a semiconductor device having a multilayer interconnection structure, comprises a substrate having a metal interconnect layer provided thereon and N number (N being an integer of 3 or greater) of layers of insulating film formed one on top of another on the substrate. Each layer of insulating film has a metal interconnect layer provided thereon. Two or more but less than all of the metal interconnect layers include a bonding pad section electrically connected to one or more of the metal interconnect layers.

According to another embodiment, a semiconductor device having a multilayer interconnection structure comprises N number (N being an integer of 2 or greater) of layers of insulating film and at least one via hole provided between respective layers. At least one bonding pad connecting hole provided between respective layers, at least one inspection opening provided in at least one of the layers of insulating film allows inspection during etching of the via hole, the at least one inspection opening not comprising a via hole or a bonding pad connecting hole.

DETAILED DESCRIPTION OF THE INVENTION

Figure 1:
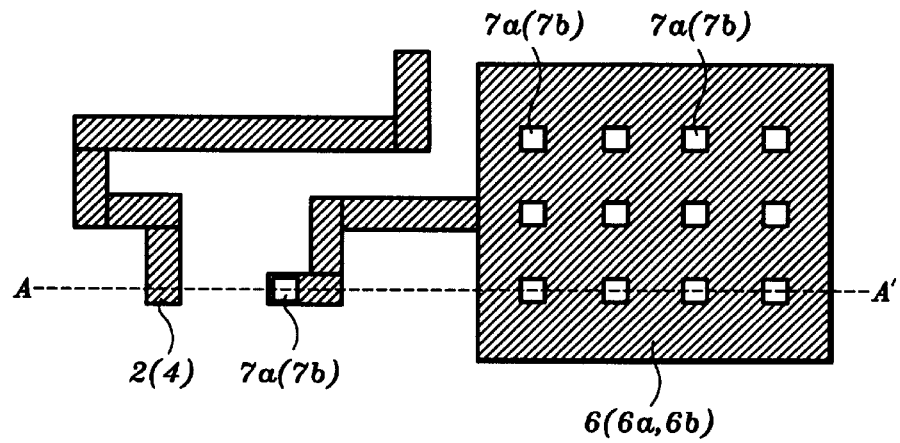
FIG. 1 is a top plan view showing a first embodiment of the present invention.

The embodiments of the present invention will now be described with reference to the accompanying drawings in which FIG. 1 shows a three-layer interconnection structure according to a first embodiment of the present invention.

After transistors, etc. (not shown) have been formed on substrate 1, a first layer of interconnecting metal 2 is deposited and formed by patterning. The first layer of interconnecting metal 2 includes a bonding pad interconnecting pattern section 6a. An inter-layer insulating film 3 is then deposited to cover first metal interconnecting layer 2. Insulating film 3 is then flattened by CMP or a similar process.

More specifically, to meet lithographic requirements, inter-layer insulating film 3 is flattened by CMP or a similar process until the difference in height levels on the surface of film 3 is reduced to 0.3 $\mu$m or less. This flatness requirement is based on the following reasoning. When patterning an extremely fine interconnection pattern, such as 0.5 $\mu$m lines and spaces, the lithographic focal depth becomes approximately 1.5 $\mu$m and the positional accuracy on the device is required to be approximately 0.75 $\mu$m for the current stepper. Accordingly, the difference in level in the interconnecting section must be approximately 0.75 $\mu$m or less total. When the flattening process is implemented twice for a three layer interconnection (that is, each of the first two insulating layers is flattened), the flatness of each layer must be 0.325 $\mu$m or less, preferably 0.30 $\mu$m or less, so that the total difference in level stays under the required maximum permissible value.

Figure 2:
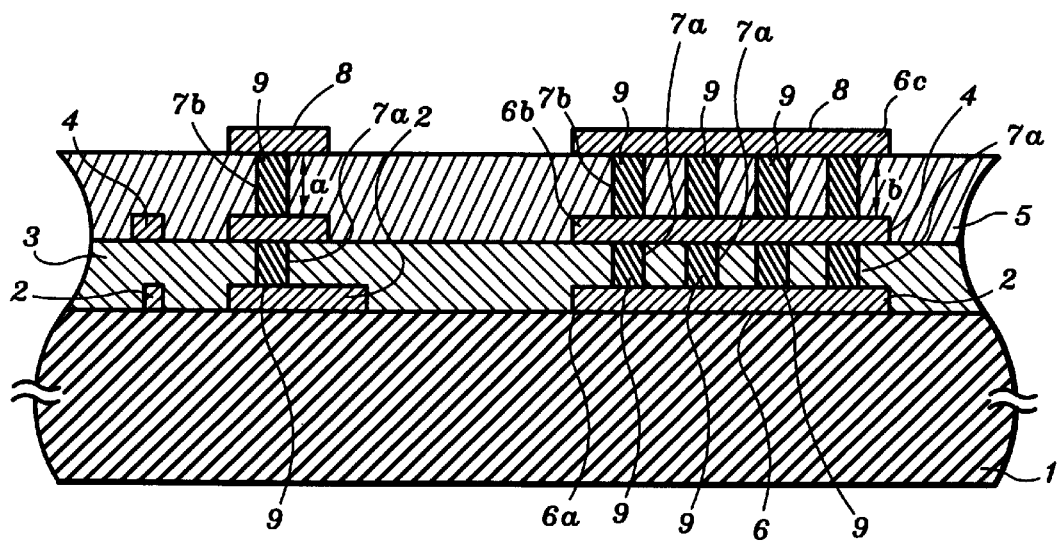
FIG. 2 is a sectional view taken along lines A–A' shown in FIG. 1.

Next, the inter-layer insulating film 3 is subjected to resist patterning for lithographically producing the via holes 7a. At this time, resist patterning is also performed on the bonding pad interconnecting pattern section 6 so that a plurality of via holes 7a are also formed in arrays as illustrated in FIGS. 1 and 2. Dry etching is then performed to etch the inter-layer insulating film 3 to form the via holes 7a. Next, tungsten (W) is deposited by CVD or a similar process, so that the via holes 7a are filled with metal (tungsten) 9 by a filling metal process such as a blanket tungsten technique or a similar technique. The tungsten is etched back so that tungsten is left only in the via holes 7a. A second metal interconnecting layer 4 is then formed on the inter-layer insulating film 3.

In the alternative, via holes 7a of the first layer may be filled by a process in which the via holes 7a are filled and the second metal interconnecting layer 4 are formed in a single step by hot sputtering or by reflowing an aluminum (Al) type material. However, using this process, it is important to eliminate contact through a plane between the first metal interconnecting layer 2 and the second metal interconnecting layer 4 by accurately arranging the plurality of via holes in arrays on the bonding pad interconnecting pattern section 6.

In either case, the first bonding pad interconnecting pattern section 6a and the second bonding pad interconnecting pattern section 6b are thus connected by the metal 9 formed in the via holes 7a.

The above process is repeated to form inter-layer insulating film 5 covering second metal interconnection layer 4.

In the first embodiment illustrated in FIGS. 1 and 2, the depths of the second via holes 7b are substantially the same, with the difference in depths "a" and "b" being controlled during the flattening process to be approximately 0.6 μm or is less at maximum. The finished via hole diameter after via hole etching is 0.05 μm or less after the lithography process is complete. More specifically, the conventional problem which occurs causing the diameter of the finished via hole to be larger than it should be (called CD loss) will not occur as long as the difference in depth between "a" and "b" is controlled to be 0.6 μm or less, although that will to some extent depend on the pattern on the base metal.

Figure 14:
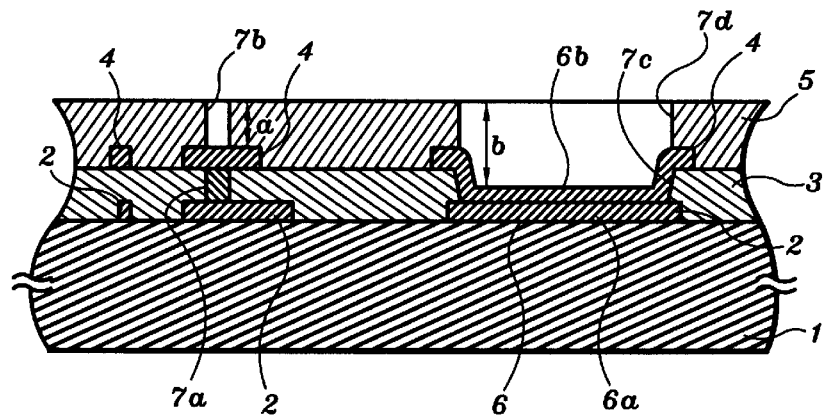
FIG. 14 is a sectional view taken along lines A–A' shown in FIG. 13.
Figure 15:
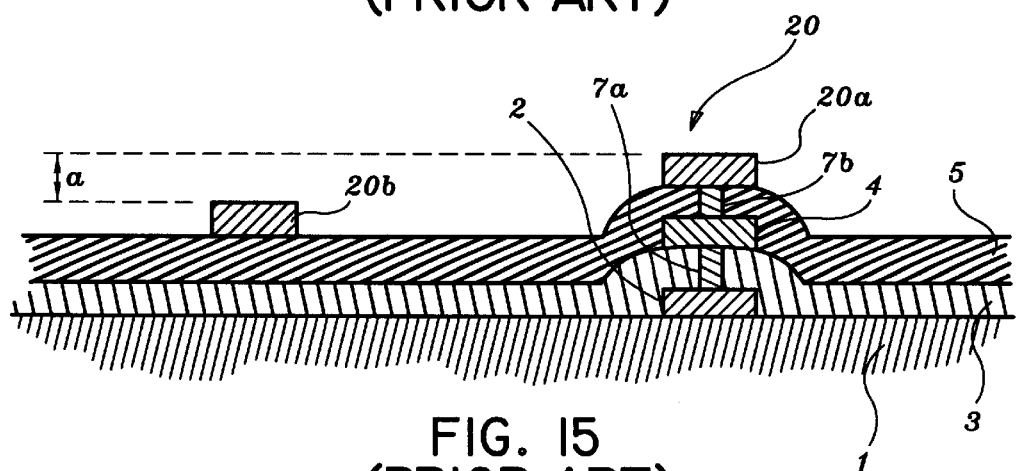
FIG. 15 is another sectional view of a conventional interconnection.

In contrast to the above-described embodiment, in a conventional device as shown in FIG. 14, for example, if the thickness of the metal interconnecting layer 4 is 0.6 μm and the thickness of the inter-layer insulating film 5 on the metal interconnecting layer 4 is 1.0 μm, then the depth "b" has a nominal value of 2.0 μm and will have a value of 2.6 μm maximum. As a result, the CD loss after etching will be two or three times that with respect to the ideal lithographically finished diameter, causing a problem in that the design rules for the interconnection must be eased.

Table 1 shows the measured results of the CD loss of the via holes according to the first embodiment of the present invention, compared with the example of conventional device:

TABLE 1

|  | Mask Size | Via Hole Dia. After Etching the Pad | Via Hole CD Loss |
| --- | --- | --- | --- |
| Conventional | 0.50 μm | 0.64 μm | 0.14 μm |
| Invention | 0.50 μm | 0.55 μm | 0.05 μm |

Figure 3:
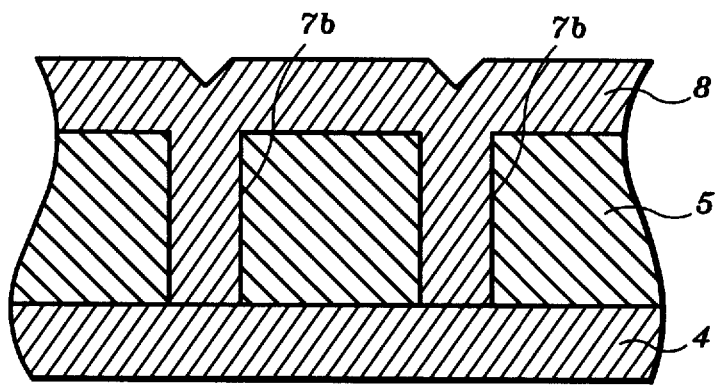
FIG. 3 is a sectional view showing interconnecting layers which are connected through via holes.

In the case of a three-layer interconnection, it is preferable to use a filling metal process such as the blanket tungsten technique, whereby the via holes 7b are filled with tungsten (W) by CVD or a similar process and etched back so that the tungsten is left only in the via holes. This method is recommended instead of the method in which the filling of the via holes and the forming of the interconnecting layer are performed in a single step by hot sputtering or by reflowing an aluminum (Al) type material. That is, using the latter method, a problem may occur wherein recesses such as those shown in FIG. 3 are produced on the third metal interconnecting layer 8 above the via holes, because of the amount of metal which must be supplied into the via holes. This leads to the bonding pad interconnecting section 6c not being flat. Preferably, the bonding pad interconnecting pattern section 6c is flat because it is the section where the semiconductor chip is connected to the frame by bonding wires. Accordingly, if the bonding pad pattern section 6c is uneven, then the bonding strength will be adversely affected.

Figure 4:
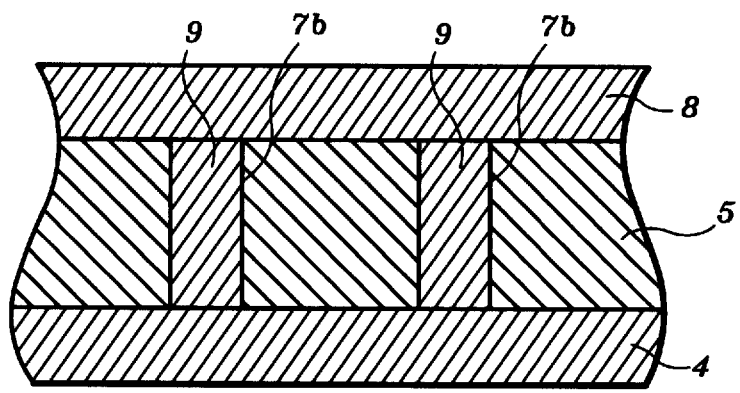
FIG. 4 is another sectional view showing interconnecting layers which are connected through via holes.

As shown in FIG. 4, when the via holes 7b are filled with metal by a filling metal process, etching back or CMP may be used for flattening the metal in the via holes to the same level as the top of insulating film 5. The surface of the third metal interconnecting layer 8 which is provided on the via holes will then be flat, as shown.

Preferably, when using the filling metal process, all via holes are the same size. However, it has been verified by experiment that the via holes can be adequately filled with metal even when the via holes vary in size. That is, even when some of the via holes are up to twice as large as the smallest via holes, or even when the via holes are rectangular-shaped holes in which the shortest side is up to twice as large as the smallest size via hole, all via holes will be adequately filled by the filling metal process.

Although the filling metal process, including etching back, renders good results when dry etching is used, the use of CMP leads to an even more uniform surface (or better flatness) for depositing the interconnecting metal on the third layer.

When the via holes are twice as large as the smallest size via hole (or are rectangular-shaped holes in which the shortest side is up to twice as large as the smallest size via hole) and are filled with tungsten (W) or the like, the metal may not always evenly fill all of the via holes. However, if this occurs, using a flow-type depositing process such as hot sputtering in addition to the filling metal process can further improve the flatness of the interconnection section. It has been verified that almost perfect flattening can be accomplished even if, for example, variations in height of the filling metal in a 1-μm hole is about ±0.3 μm, so that bonding strength will not be adversely effected.

Referring back to FIGS. 1 and 2, following the processes described above, the third metal interconnecting layer 8 is formed. Thus, the connection between the first metal interconnecting layer 2 and the second metal interconnecting layer 4 and between the second metal interconnecting layer 4 and the third metal interconnecting layer 8 is made through via holes 7a and 7b (respectively) using filling metal 9.

Typically, a passivation film (not shown) is deposited on the third metal interconnecting layer 8 and a large opening is provided above the bonding pad interconnecting pattern section 6, thus completing the semiconductor device.

A second embodiment of the present invention allows easier inspection after via hole etching compared to the first embodiment described above by adding an opening for checking via hole pattern etching.

According to the first embodiment, the connection between the first metal interconnecting layer 2 and the second metal interconnecting layer 4 is accomplished solely by the fillable via holes 7a which are filled by filling metal 9. More specifically, as illustrated in FIG. 2, the bonding pad interconnection pattern section 6a is connected to with the bonding interconnection pattern section 6b by the plurality of via holes 7a. This assures a constant depth of the via holes 7b on the second metal interconnecting layer 4, thereby obviating the problem in which the hole diameter is increased during etching.

However, to perform optical detection of via hole etching depth with such small via holes (which may be 10% the size of the via holes in a conventional semiconductor device) requires a very powerful and relatively expensive microscope for observing the etching process. This is not practical in all cases. This prevents successful detection of an optical end point at the time of etching. Therefore, the etching time must be performed according to a calculated fixed time. This requires an operator to carefully determine the etching conditions and to calculate the fixed time accordingly. The etching is therefore based on time alone.

In contrast, the etching time of the via holes is conventionally determined by adding an over-etching time to the time when an optical end point is detected by observation with a microscope. This is generally a convenient method and since etching is also based on observation, the etching conditions are not as critical. However, it takes more time to determine the proper etching conditions when the configuration shown by the first embodiment is used because it is based on time control alone. That is, since all of the via holes are the same size and relatively small, an optical detection is not practical and a more time consuming method is required with the first embodiment when compared with a conventional device and method.

The etching conditions must be established for each type of product. Therefore, in order to shorten a product prototyping period of time, the second embodiment provides an inspection pattern opening as described below. The second embodiment is also advantageous in that it permits easy in-line inspection for mass production.

Figure 5:
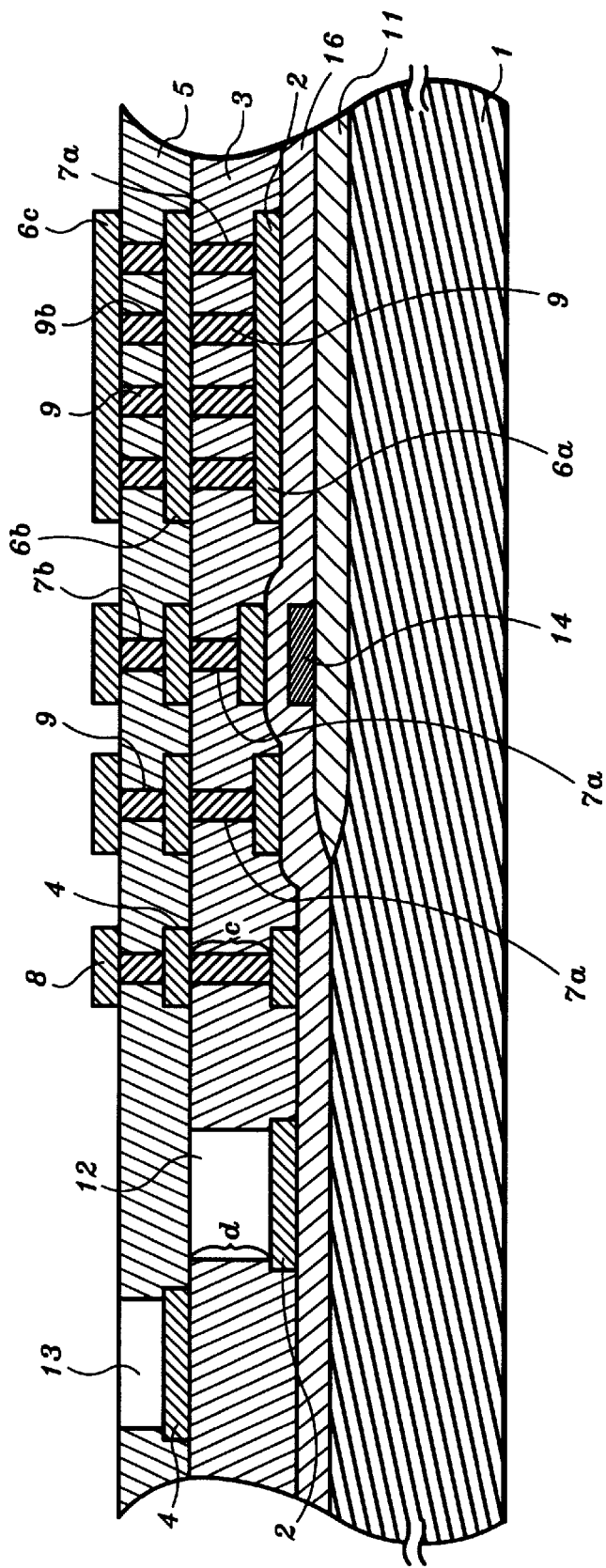
FIG. 5 is a sectional view showing another embodiment of the present invention.

In the second embodiment of the present invention as shown in FIG. 5, interconnecting metal layers 2 and 4 are disposed beneath inspection pattern openings 12 and 13, respectively, for checking via hole etching. These portions of interconnecting metal 2 and 4 are not used for electrical connection. Instead, these portions are used to provide a pattern for checking, under a metallurgical microscope, whether the via holes 7a and 7b have properly been opened. That is, inspection pattern openings 12 and 13 are observed during etching of via holes 7a and 7b, respectively. If the inspection openings 12 and 13 have not been completely opened by etching, they will look colored because of optical interference. Accordingly, it can be determined when the proper depth of etching has been reached, by optical inspection with a conventional metallurgical microscope.

This embodiment will be described in more detail by reference to FIG. 5. First, transistors are formed on the silicon substrate 1 and a gate interconnection 14, etc. are disposed on a field oxide film 11. The silicon substrate is then covered with an insulating film 16. The first layer of interconnecting metal is deposited on the silicon substrate 1 (actually onto film 16) and the first metal interconnecting layer 2 is formed by patterning. In this case, the insulating film 16 may or may not have been flattened. The first metal interconnecting layer 2 is provided with a bonding pad interconnecting pattern 6a. Inter-layer insulating film 3 is deposited and the inter-layer insulating film 3 is flattened by CMP or a similar process.

Next, film 3 is patterned to make the first via holes 7a. At this time, film 3 is also patterned so that at least one inspection opening 12 is also provided on the semiconductor chip, preferably in the dicing line section of the chip. As in the first embodiment described above, film 3 is also patterned to form bonding pad interconnecting pattern section 6 including a plurality of via holes 7a arranged in an array. The inter-layer insulating film 3 is then etched by dry etching to form the via holes 7a and the inspection opening 12.

If CMP or a similar process is used only on the inter-layer insulating film 3 (i.e., if flattening is not performed on film 16), then the depths of the first via holes 7a will vary because the height of the base metal interconnecting layer 2 from the silicon substrate 1 is not even. For this reason, according to this embodiment, in order to make the via etching inspection method more reliable, the height of the metal interconnecting layer 2 provided immediately beneath the inspection opening 12 is always based on the deepest one of via holes 7a, so that the deepest via hole 7a and the inspection opening 12 are the same depth.

According to this embodiment, when optical inspection is carried out using a metallurgical microscope, reliable inspection is possible by increasing the magnification of the microscope, as long as inspection opening 12 is 1 $\mu$m square or more. In practical applications, however, the typical magnification ranges from ×50 to ×150 and therefore opening 12 should be 10 $\mu$m square or larger. If the etching time of film 3 is too short, causing insulating film 3 to remain on the metal interconnecting layer 2 below inspection opening 12, the inspection opening 12 will appear to be a shade of brown which depends on the thickness of the remaining film.

After etching the inter-layer insulating film 3, the inspection opening 12 is optically checked by microscope to make certain that the via holes 7a have been properly opened. Then, a filling metal process such as the blanket tungsten technique is performed, whereby via holes 7a and inspection opening 12 are filled with tungsten (W) by CVD or a similar process. The tungsten is then etched back so that tungsten is left only in the holes. After the etching and inspection process is complete for the first layer, if inspection opening 12 has not been filled or is only partially filled with tungsten, then inspection opening 12 can be filled with a suitable insulating material, for example. The second metal interconnecting layer 4 is then formed on the inter-layer insulating film 3.

Next, the step described above is repeated to provide the inter-layer insulating film 5 which covers the second metal interconnecting layer 4. Insulating film 5 is then patterned and etched to form via holes 7b and the inspection opening 13 in the inter-layer insulating film 5. Preferably, the inspection opening 13 is formed in a different position from that of inspection opening 12 formed in lower layer 3 (i.e., it is positioned to not overlap with the inspection opening 12 so as to provide better mechanical strength to the semiconductor device). The etching of via holes 7b can then be determined by monitoring the etching of inspection opening 13.

According to this embodiment of the present invention, inspection openings 12 and 13 measure 80×80 $\mu$m. If insulating film remains on the interconnecting metal directly below inspection openings 12 and 13 due to an insufficient amount of etching time, the inspection openings 12 or 13 will look brown when viewed through the microscope.

The embodiment of the present invention makes it possible to determine by in-line inspection, if insulating film remains on the interconnecting metal, which may result from defective or insufficient etching. This allows faster determination of etching conditions. The same advantage was observed regardless of whether the etching inspection opening was disposed within the pattern area or in the dicing line section of the semiconductor wafer.

Figure 6:
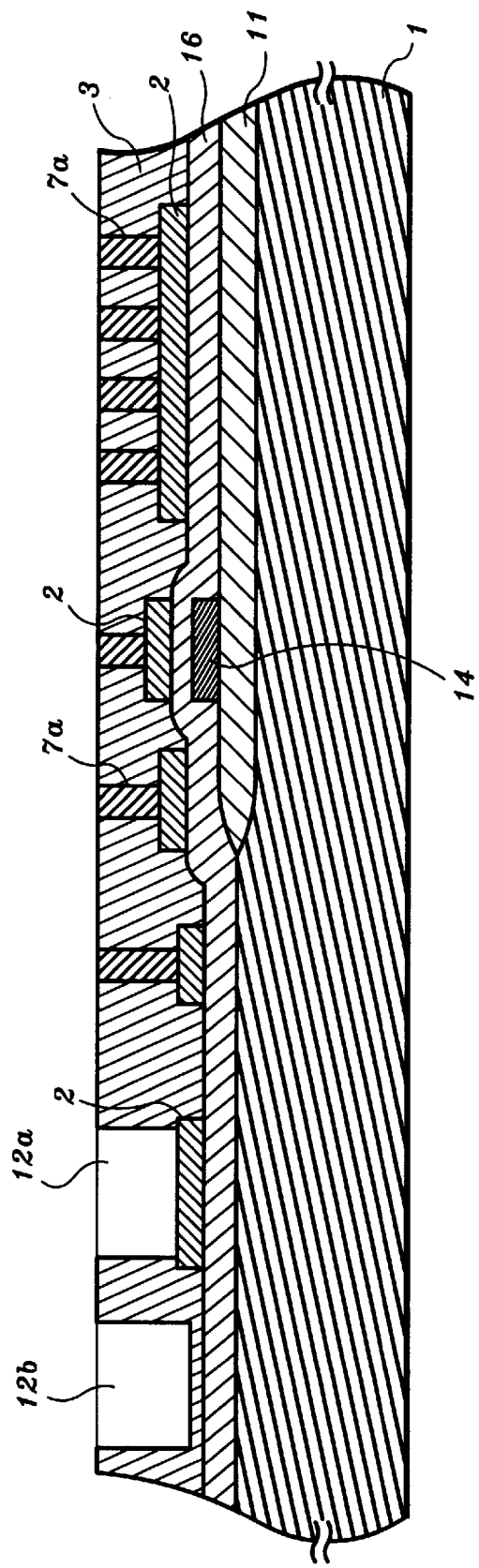
FIG. 6 is a sectional view showing another embodiment of the present invention.

The embodiment shown in FIG. 6 includes openings for monitoring the film thickness during and after etching by using an optical film thickness meter. More specifically, an inspection opening 12a is provided above metal interconnecting layer 2. Inspection opening 12a is similar to and serves the same purpose as inspection opening 12 described above with respect to FIG. 5. However, according to this embodiment, inspection opening 12b, which has no metal interconnecting pattern disposed therebelow, is also provided. According to this embodiment, the etching inspection step described above must be carried out twice. However, this allows the etching to be even more accurately monitored.

According to this embodiment, inspection opening 12b is the same size as inspection opening 12a (e.g., 80×80 $\mu$m). The film thickness remaining in hole 12b (i.e., the thickness of film 3 remaining above film 16) can be measured using an optical measuring instrument. Although the measurement can be implemented in an opening which is 5 $\mu$m square or larger, the opening should preferably be at least 10 $\mu$m square or larger to enable easier and more reliable measurements to be performed.

This embodiment enables higher accuracy and accordingly higher yield because, if an etching problem occurs, the amount of required additional etching can be accurately determined while making certain that over-etching does not occur. This is in addition to the advantages described above with respect to the embodiment shown in FIG. 5.

This embodiment also permits more accurate monitoring when determining etching conditions. This has shortened the etching time by approximately 15% compared with the etching time required when an over-etching time is added to the etching time for safety because a visual inspection could not be performed. The result is higher throughput.

Figure 7:
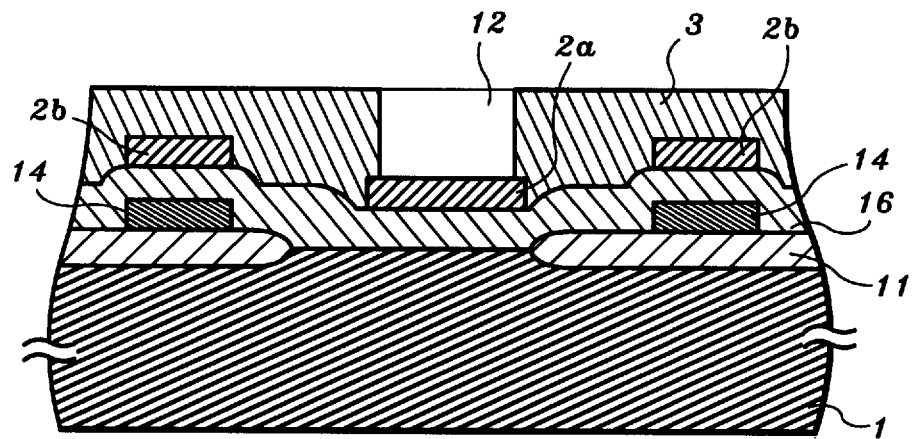
FIG. 7 is a sectional view showing another embodiment of the present invention.
Figure 8:
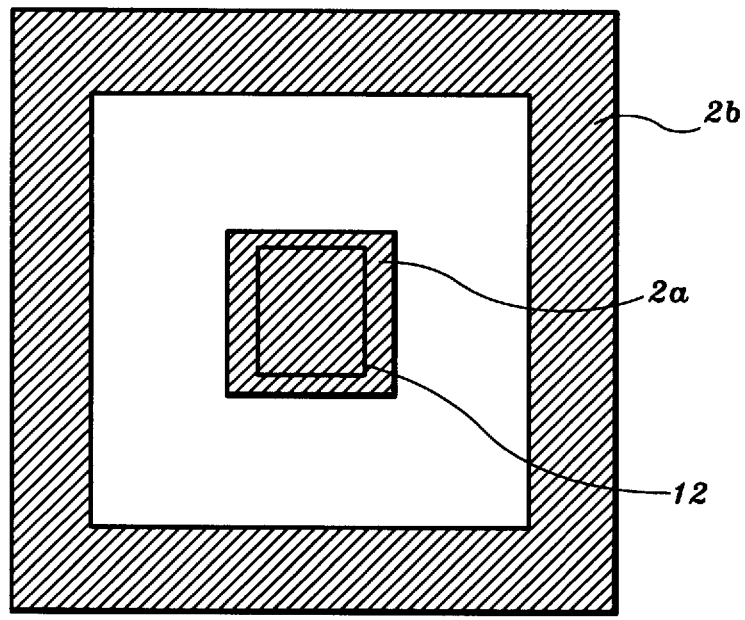
FIG. 8 is a top plan view of the embodiment of the present invention shown in FIG. 7.

FIGS. 7 and 8 show an inspection opening 12 which is provided in a deepest portion of insulating film 3 and above metal interconnecting pattern 2a. Inspection opening 12 is surrounded by an interconnecting pattern 2b (which has a line width of 5 $\mu$m) which is positioned at the same height from substrate 1 as the highest metal interconnecting pattern. This inspection opening 12 and pattern 2 (2a and 2b) are formed in the dicing line section of the semiconductor. The reason for providing metal interconnecting pattern 2 around inspection opening 12 is that it has been found that the thickness of film 3 above metal interconnecting pattern 2a is 0.05 m thicker when compared with a case in which metal interconnecting pattern 2b is not formed around metal interconnecting pattern 2a. That is, providing metal interconnecting pattern 2b around pattern 2a in the dicing line section more closely resembles the structure in the circuit portion of the semiconductor. Therefore, the height of the insulating layer will more closely follow the height of the insulating film in the via holes being etched.

This additional thickness of film 3 corresponds to an additional etching time of 1 to 2 seconds which could adversely effect etching of the via holes (not shown). Therefore, surrounding pattern 2b should be used. Providing such a surrounding pattern 2b, however, requires a relatively large area, making it disadvantageous when disposing it in a chip circuit pattern area. Therefore, this embodiment should be implemented in the dicing line section of the semiconductor.

Although CMP permits global flattening of a surface of the semiconductor, the uniformness of flattening does depend on the metal interconnect patterns. Therefore, even CMP may leave a slight difference in level among patterns. The embodiment shown in FIGS. 7 and 8 ensures that the deepest metal interconnect pattern is below an inspection opening, with the height of the film above that metal interconnect pattern in the inspection opening being close to the height of the film above the via holes corresponding to the deepest patterns. This embodiment thus allows deep openings to be formed with improved reliability of the etching procedure by allowing more accurate inspection.

Figure 9:
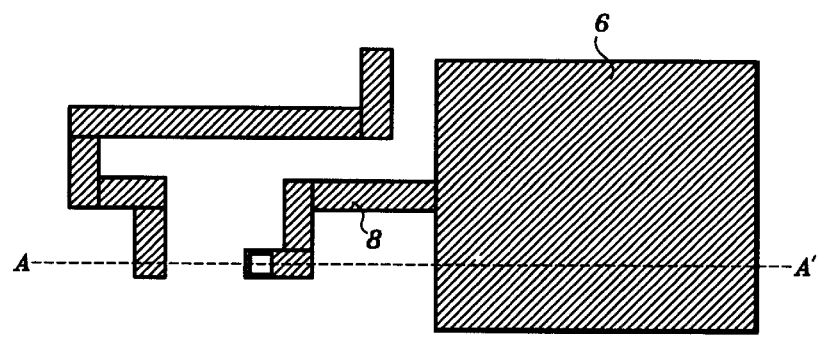
FIG. 9 is a top plan view showing another embodiment of the present invention.
Figure 10:
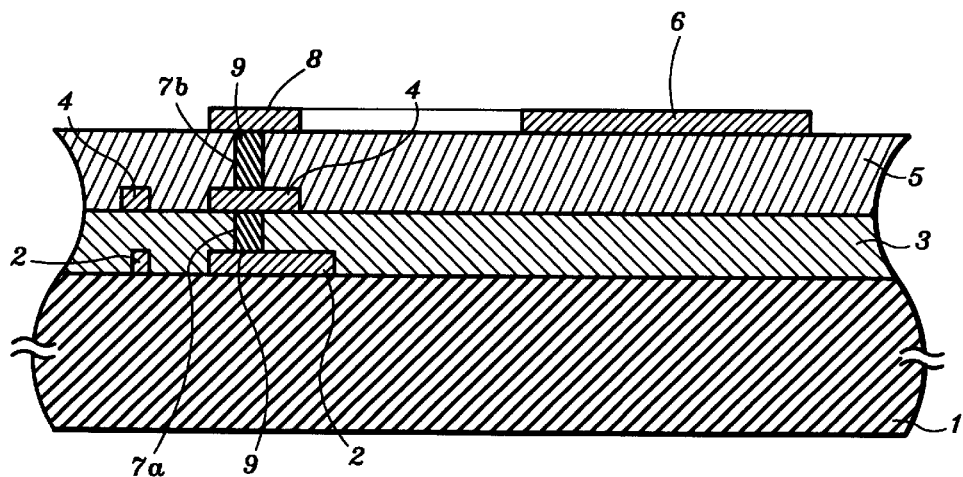
FIG. 10 is a sectional view taken along lines A–A' shown in FIG. 9.

FIGS. 9 and 10 show another embodiment of the present invention, wherein the bonding pad interconnecting pattern section 6 is provided only on the topmost layer of a multilayer semiconductor.

This embodiment will be described by way of example using a three-layer interconnection. First, transistors (not shown) are formed on substrate 1. Then, a first layer of interconnecting metal is deposited on silicon substrate 1 and metal interconnecting layer 2 is formed by patterning and etching. As shown in FIG. 10, a bonding pad interconnecting pattern section is not formed on the first layer. The inter-layer insulating film 3 is then deposited and, if so desired, the inter-layer insulating film 3 is flattened by CMP or a similar process. via hole 7a is then formed in the inter-layer insulating film 3 and filled with tungsten, for example. A layer of interconnecting metal is deposited and patterning and etching are performed to form metal interconnecting layer 4. As shown, the second metal interconnecting layer 4 is also not provided with a bonding pad interconnecting pattern section. Then, the second inter-layer insulating film layer 5 is deposited and flattened, and the second via hole 7b is patterned, etched and filled with metal. A layer of interconnecting metal 8 is deposited thereon and patterning and etching are performed to form metal interconnecting layer 8. The bonding pad interconnecting pattern section 6 is formed only by the third metal interconnecting layer 8. A passivation film is provided on the top layer and is patterned and etched to provide openings only above the bonding pad interconnecting pattern sections.

Accordingly, in this embodiment, the lower metal interconnecting layer 2 is connected to the middle metal interconnecting layer 4 by metal filled via hole 7a. Middle interconnecting layer 4 is connected to third metal interconnecting layer 8 by metal filled via hole 7b, with third metal interconnecting layer 8 being electrically connected with bonding pad interconnecting pattern section 6.

When compared with the configuration of the first embodiment, this embodiment provides a simpler configuration and permits further more uniform flatness of the bonding pad interconnecting pattern section with resultant higher reliability. Although this embodiment is useful in many instances, since all connections to the bonding pads are made at the top layer, all of the interconnections must be located near the bonding pad interconnecting pattern section 6, which adds slightly to the size of the chip. In other words, making each connection to the third (or top) layer through via holes 7a and 7b from any place on the chip may mean overcrowded interconnection on the third layer. Therefore, it may be necessary to make many of the connections to the upper layer through via holes provided in the vicinity of the bonding pad interconnecting pattern section.

It should be noted that the opening in the passivation film layer (not shown) for the bonding pad interconnecting pattern section is provided only on the bonding pad interconnecting pattern section. Therefore, even if this top layer is somewhat thick, there is no need to worry about the hole etching problem previously described since no via holes exist in the top layer.

According to a fourth embodiment of the present invention, the bonding pad interconnecting pattern sections are disposed on the n-th metal interconnecting layer (i.e., the top layer) and the (n–1)th metal interconnecting (i.e., the layer directly below the top layer) so that the chip size may be reduced slightly compared with that possible in the third embodiment. The fourth embodiment also increases the degree of design freedom because it allows more metal interconnecting layers to be connected to the bonding pad interconnecting pattern sections.

Figure 11:
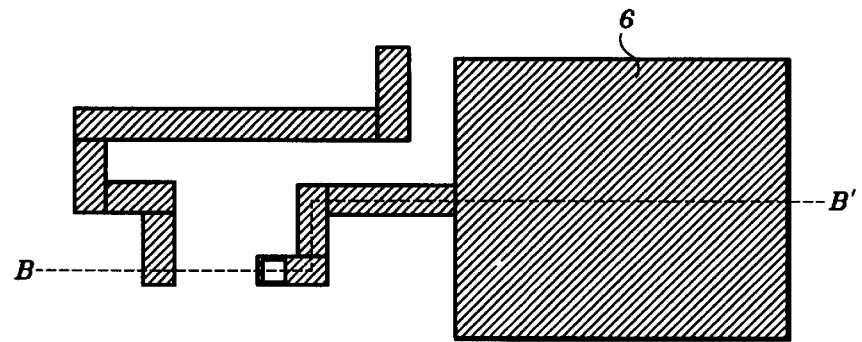
FIG. 11 is a top plan view showing still another embodiment of the present invention.
Figure 12:
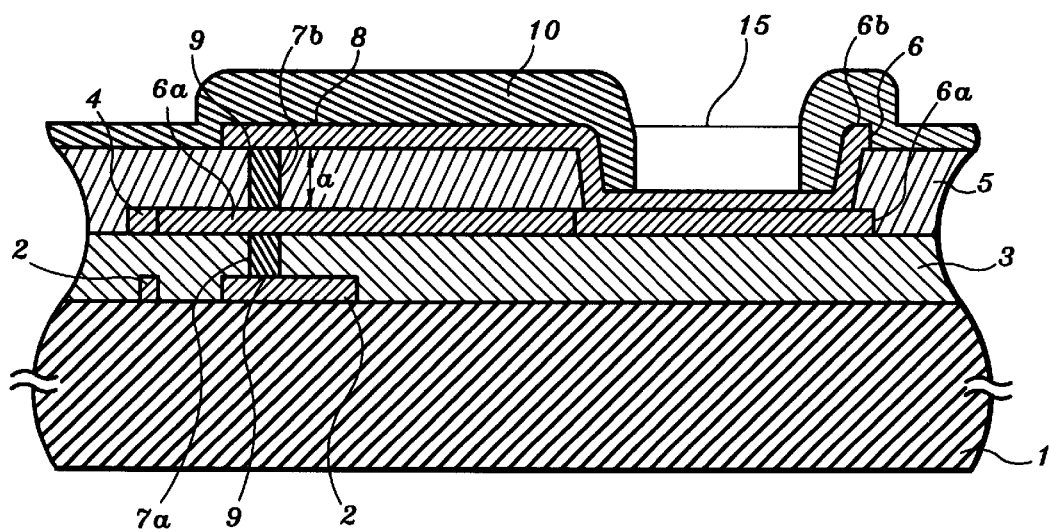
FIG. 12 is a sectional view taken along lines B–B' shown in FIG. 11.
Figure 13:
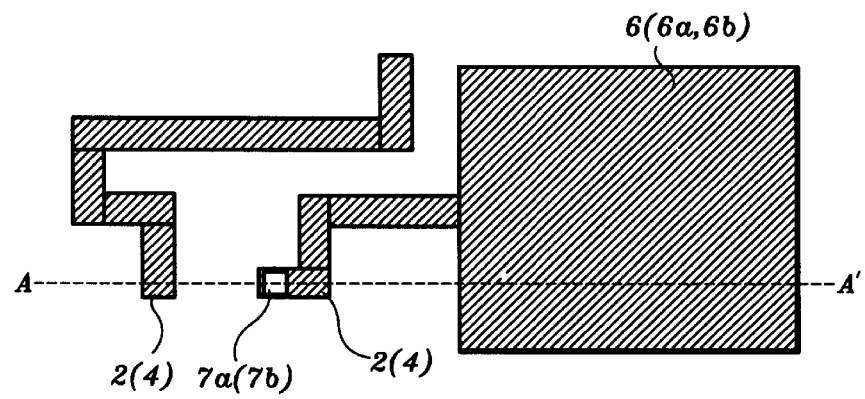
FIG. 13 is a top plan view showing a conventional interconnection.

FIGS. 11 and 12 show still another embodiment of the present invention. The metal interconnecting layer or layers closest to the silicon substrate 1 are not provided with a bonding pad interconnecting pattern section. This embodiment is similar to the embodiment described above with respect to FIGS. 9 and 10 in which the bonding pad interconnecting pattern section 6 is formed only on the topmost layer of the multilayer metal interconnecting layer. However, as shown in FIG. 12, according to this embodiment, the layer directly below the top layer also includes a bonding pad interconnecting pattern section.

This embodiment will be described in more detail using as an example, a three-layer interconnection as shown in FIG. 12. Of course, it should be understood that this embodiment is applicable to any number of layers and that the bonding pad interconnecting pattern sections can be provided on two or more, but less than all, of the layers. First, transistors (not shown) are formed on substrate 1. Then, the first layer of interconnecting metal is deposited on the silicon substrate 1, patterned and etched to form metal interconnecting layer 2. An insulating film 3 is then deposited and flattened by CMP or a similar process. As shown in FIG. 12, no bonding pad interconnecting pattern section is formed on the first metal interconnecting layer 2.

Via hole 7a is formed in the inter-layer insulating film 3 by patterning and etching. Via hole 7a is then filled with tungsten or another metal 9. A layer of interconnecting metal is then deposited, patterned and etched to form second metal interconnecting layer 4. As shown in FIG. 12, bonding pad interconnecting pattern section 6a is formed by this second metal interconnecting layer 4. Accordingly, first metal interconnecting layer 2 provided in the lower layer can be connected to the bonding pad interconnecting pattern section 6a in the middle layer through metal filled via hole 7a and by second metal interconnecting layer 4. An insulating film 5 is then deposited. Second inter-layer via hole 7b is then patterned and etched. At this time, the bonding pad interconnecting pattern section 6a is also exposed by etching insulating film 5 so that a large opening is formed above bonding pad interconnecting pattern section 6a. The via hole 7b and the opening above the bonding pad interconnecting pattern section are the same depth "a", so that there is no need to worry about the hole etching problem previously described. The third metal interconnecting layer 8 is then formed on film 5 by depositing, patterning and etching a layer of interconnecting metal. The bonding pad interconnecting pattern section 6b is thus formed by the third metal interconnecting layer 8.

Typically, a passivation film 10 is deposited on the top layer, for example, and an opening 15 is formed by etching only the bonding pad interconnecting pattern section. In this case, flattening is not necessary and therefore need not be performed. Therefore, the passivation film 10 can be formed conformably, allowing the bonding pad interconnecting pattern section to be etched with no problem.

This embodiment of the present invention thus allows interconnection to the bonding pad section from two or more, but less than all, of the multiple layers. This prevents overcrowding of the interconnecting metal layer that might occur if the bonding pad interconnecting section were provided only on the top layer.

Thus, according to the above-described embodiments of the present invention, the inter-layer insulating film can be provided at a constant thickness so that while a via hole is being etched CD loss of the via hole can be reduced.

In addition, in-line inspection can be performed by providing at least one inspection opening for monitoring via hole etching. This permits quicker determination of the etching conditions. The use of CMP enables higher yield in the manufacture of semiconductors.

Furthermore, according to the present invention, a multilayer structure can be simplified by forming the bonding pad interconnecting pattern section only on the topmost layer of the multilayer interconnecting layers and the flatness of the bonding pad interconnecting pattern section can be further improved, thus leading to higher reliability.

Furthermore, also providing bonding pad interconnecting pattern section on the layer or layers directly below the top layer increases the degree of design freedom for designing the patterns for the metal interconnecting layers.

While for purposes of illustration and explanation, several forms of this invention have been disclosed, other forms thereof may become apparent to those skilled in the art upon reference to this disclosure and, therefore, this invention is to be limited only by the scope of the appended claims.

What is claimed is:

1. A semiconductor device having a multilayer interconnection structure, comprising:
   a substrate having a metal interconnect layer provided thereon;
   N number (N being an integer of 2 or greater) of layers of insulating film formed one on top of another on the substrate, each layer of insulating film having a metal interconnect layer including at least one bonding pad section provided thereon;
   at least one via hole filled with an electrically conductive material provided in each of the layers for interconnecting metal interconnect layers; and
   at least one bonding pad connecting hole filled with an electrically conductive material provided in each of the layers for interconnecting bonding pad sections, the at least one bonding pad connecting hole being no more than twice as large in diameter as a smallest via hole.

2. A semiconductor device as recited in claim 1, wherein the at least one bonding pad connecting hole is a rectangular opening, a shortest side thereof being no more than twice as large as a diameter of the smallest via hole.

3. A semiconductor device as recited in claim 1, wherein a plurality of via holes of various diameters are provided in each of the layers.

4. A semiconductor device as recited in claim 1, wherein a plurality of via holes of substantially the same diameter are provided in each of the layers.

5. A semiconductor device as recited in claim 1, wherein the electrically conductive material extends above or below the top of the at least one electrical connecting hole by 0.3 $\mu$m or less.

6. A semiconductor device as recited in claim 1, wherein the electrically conductive material is selected from the group consisting of aluminum and tungsten.

7. A semiconductor device as recited in claim 1, wherein a plurality of bonding pad connecting holes are provided in each of the layers.

8. A semiconductor device as recited in claim 1, wherein each of the N number of layers of insulating film has a substantially flat surface.

9. A semiconductor device as recited in claim 1 or 2, wherein the at least one bonding connecting hole filled with the electrically conductive material can provide electrical input and output signals to the metal interconnect layers.

10. A semiconductor device as recited in claim 8, wherein a height of the substantially flat surface of each of the N number of layers of insulating film varies by 0.3 μm or less.

11. A semiconductor device having a multilayer interconnection structure, comprising:

a substrate having a metal interconnect layer provided thereon;

N number (N being an integer of 2 or greater) of layers of insulating film formed one on top of another on the substrate, each layer of insulating film having a metal interconnect layer provided thereon, wherein only the metal interconnect layer provided on the top layer of insulating film includes at least one bonding pad section electrically connected to one or more of the metal interconnect layers.

12. A semiconductor device as recited in claim 11, further comprising at least one via hole filled with an electrically conductive material provided in each of the layers for interconnecting metal interconnect layers.

13. A semiconductor device as recited in claim 12, wherein the at least one bonding pad section is electrically connected to one or more of the metal interconnect layers formed on insulating layers below the top metal interconnect layer, by the at least one via hole provided in each layer.

14. A semiconductor device having a multilayer interconnection structure, comprising:

N number (N being an integer of 2 or greater) of layers of insulating film;

at least one via hole provided between respective layers;

at least one bonding pad connecting hole provided between respective layers; and at least one inspection opening provided in at least one of the layers of insulating film, the at least one inspection opening not comprising a via hole or a bonding pad connecting hole, wherein the at least one inspection opening is capable of being used during formation of the semiconductor device for allowing inspection during etching of the via hole.

15. A semiconductor device as recited in claim 14, wherein the at least one inspection opening is provided in a dicing line section of a semiconductor wafer.

16. A semiconductor device as recited in claim 14, wherein the at least one inspection opening is provided in a portion of the semiconductor device.

17. A semiconductor device as recited in claim 14, wherein the at least one inspection opening has an area of 1 μm square or more.

18. A semiconductor device as recited in claim 14, wherein the at least one inspection opening has an area of 10 μm square or more.

19. A semiconductor device as recited in claim 14, wherein a plurality of inspection openings are provided, one in each of a plurality of layers of the semiconductor device.

20. A semiconductor device as recited in claim 14, further comprising at least one metal interconnect layer provided on each layer of insulating film, wherein an interconnect layer can have different heights and wherein an interconnecting pattern, which is provided directly below the inspection opening is based in an interconnecting pattern which is the lowest interconnecting pattern for that layer.

21. A semiconductor device as recited in claim 19, wherein the plurality of inspection openings are provide in different positions on each of the respective plurality of layers.

22. A semiconductor device having a multilayer interconnection structure, comprising:

N number (N being an integer of 2 or greater) of layers of insulating film;

at least one via hole provided between respective layers;

at least one bonding pad connecting hole provided between respective layers; and a plurality of inspection openings provided in at least one of the layers of insulating film, the plurality of inspection openings not comprising a via hole or a bonding pad connecting hole, wherein at least one of the plurality of inspection openings has an interconnection pattern provided therebelow and another of the plurality of inspection openings does not have an interconnection pattern provided therebelow, wherein the plurality of inspection openings are capable of being used during formation of the semiconductor device for allowing inspection during etching of the via hole.

23. A semiconductor device as recited in claim 22, wherein at least one inspection opening is provided in a plurality of the N number of layers of insulating film.

24. A semiconductor device as recited in claim 22, wherein the at least one of the plurality of inspection openings includes an interconnecting pattern surrounding it.

* * * * *

UNITED STATES PATENT AND TRADEMARK OFFICE
CERTIFICATE OF CORRECTION

PATENT NO.   : 5,847,466
DATED        : December 8, 1998
INVENTOR(S)  : Kazunori Ito et al.

It is certified that error appears in the above-identified patent and that said Letters Patent is hereby corrected as shown below:

Column 12,
Line 31, insert the following claim:
-- 1.  A semiconductor device having a multilayer interconnection structure, comprising:
 a substrate having a metal interconnect layer provided thereon;
 N number (N being an integer of 2 or greater) of layers of insulating film formed one on top of another on the substrate, each layer of insulating film having a metal interconnect layer including at least one bonding pad section provided thereon;
 at least one vial hole filled with an electrically conductive material provided in each of the layers for interconnecting metal interconnect layers; and
 at least one bonding pad connecting hole filled with an electrically conductive material provided in each of the layers for interconnecting bonding pad sections, the at least one boding pad connecting hole being no more than twice as large in diameter as a smallest via hole, wherein a plurality of bonding pad connecting holes are used to interconnect a same corresponding pair of bonding pad sections provided on alternate layers of insulating film. --

UNITED STATES PATENT AND TRADEMARK OFFICE
CERTIFICATE OF CORRECTION

PATENT NO.   : 5,847,466
DATED        : December 8, 1998
INVENTOR(S)  : Kazunori Ito et al.

It is certified that error appears in the above-identified patent and that said Letters Patent is hereby corrected as shown below:

Column 13,
Line 11, insert the following claim:
  -- 11. A semiconductor device having a multilayer interconnection structure, comprising:
   a substrate having a metal interconnect layer provided thereon;
   N number (N being an integer of 2 or greater) of layers of insulating film formed one on top of another on the substrate, each layer of insulating film having a metal interconnect layer provided thereon, wherein only the metal interconnect layer provided on the top layer of insulating film includes at least one bonding pad section electrically connected to one or more of the metal interconnect layers, wherein all external electrical connections to the semiconductor devices are made via the at least one bonding pad section. --

Signed and Sealed this

Twentieth Day of April, 2004

JON W. DUDAS
*Acting Director of the United States Patent and Trademark Office*